(12) United States Patent
Kim et al.

(10) Patent No.: US 9,531,286 B2
(45) Date of Patent: Dec. 27, 2016

(54) CONTROL OF A CONVERTER FOR AN ELECTRIC VEHICLE

(75) Inventors: Sung Kyu Kim, Gyeonggi-do (KR); Jaewon Lee, Gyeonggi-do (KR); Tae Hwan Chung, Incheon (KR); Ki Jong Lee, Gyeonggi-do (KR); Jong Kyong Lim, Gyeonggi-do (KR); Sang Hoon Kwak, Gyeonggi-do (KR)

(73) Assignees: Hyundai Motor Company, Seoul (KR); Kia Motors Corporation, Seoul (KR)

( * ) Notice: Subject to any disclaimer, the term of this patent is extended or adjusted under 35 U.S.C. 154(b) by 1420 days.

(21) Appl. No.: 13/313,943

(22) Filed: Dec. 7, 2011

(65) Prior Publication Data

US 2012/0292989 A1 Nov. 22, 2012

(30) Foreign Application Priority Data

May 20, 2011 (KR) .................. 10-2011-0048076

(51) Int. Cl.

| | |
|---|---|
| *B60L 3/00* | (2006.01) |
| *H02M 3/337* | (2006.01) |
| *H02M 1/32* | (2007.01) |
| *H02P 6/08* | (2016.01) |
| *H02P 29/02* | (2016.01) |
| *H02P 27/08* | (2006.01) |
| *B60L 11/00* | (2006.01) |
| *G01R 31/00* | (2006.01) |

(52) U.S. Cl.
CPC ............ *H02M 3/3376* (2013.01); *H02M 1/32* (2013.01); *H02P 6/08* (2013.01); *H02P 27/08* (2013.01); *H02P 29/024* (2013.01); *H02P 29/0241* (2016.02); *B60L 11/00* (2013.01); *G01R 31/002* (2013.01)

(58) Field of Classification Search
CPC ...... G01R 31/42; G01R 31/002; B60L 11/123; B60L 11/00; B60W 50/0205; H02M 3/3376; H02M 1/32; H02P 29/024; H02P 27/08; H02P 29/0241; H02P 6/08
USPC ...... 307/9.1, 10.1; 701/22; 318/490, 400.08, 318/400.09; 180/65.285; 290/40 F
See application file for complete search history.

(56) References Cited

U.S. PATENT DOCUMENTS

| | | | |
|---|---|---|---|
| 7,149,098 | B1 | 12/2006 | Chen |
| 2006/0227476 | A1 | 10/2006 | Yang |
| 2008/0157591 | A1* | 7/2008 | Fattal .................... B60L 11/123 307/10.1 |

(Continued)

FOREIGN PATENT DOCUMENTS

| | | |
|---|---|---|
| CN | 201374493 Y | 12/2009 |
| JP | 2003-330251 A | 11/2003 |

(Continued)

*Primary Examiner* — Arnold Kinkead
(74) *Attorney, Agent, or Firm* — Mintz Levin Cohn Ferris Glovsky and Popeo, P.C.; Peter F. Corless

(57) ABSTRACT

A method for control of an electric vehicle converter is provided. The converter is adapted to drop voltage and a counting unit is adapted to count a signal generated by the converter. The method includes inputting a signal that is generated by the converter to the counting unit during operation of the converter and counting the signal. Additionally, whether a counting result of the counting unit corresponds to a predetermined interval is determined and the converter is determined to be out-of-order when the counting result does not correspond to the predetermined interval.

14 Claims, 3 Drawing Sheets

(56) References Cited

U.S. PATENT DOCUMENTS

2012/0217920 A1* 8/2012 Singh .................... G01R 31/42
                                                    318/490
2013/0006453 A1* 1/2013 Wang ................ B60W 50/0205
                                                     701/22

FOREIGN PATENT DOCUMENTS

| JP | 2004-297943 A | 10/2004 |
|----|---------------|---------|
| JP | 2009213219 A  | 9/2009  |

* cited by examiner

CONTROL OF A CONVERTER FOR AN ELECTRIC VEHICLE

CROSS-REFERENCE TO RELATED APPLICATION

This application claims priority to and the benefit of Korean Patent Application No. 10-2011-0048076 filed in the Korean Intellectual Property Office on May 20, 2011, the entire contents of which are incorporated herein by reference.

BACKGROUND OF THE INVENTION (a) Field of the Invention

The present invention relates to control of a converter for an electric vehicle. More particularly, the present invention relates to a control method of a converter for an electric vehicle and a control system thereof for controlling the converter when the converter of the electric vehicle fails.

(b) Description of the Related Art

Generally, an electric vehicle means a vehicle driven only by electricity.

A hybrid vehicle is a vehicle in which functions of a gasoline vehicle and an electric vehicle are combined in order to remedy various drawbacks of the gasoline vehicle and the electric vehicle. Therefore, a driver of the hybrid vehicle can select a gasoline engine drive mode, an electric motor drive mode, and a hybrid mode as occasion demands.

As described above, the electric vehicle includes the hybrid vehicle in a broad sense. Therefore, the electric vehicle in a narrow sense and the hybrid vehicle are called "the electric vehicle" in this specification.

Since petroleum is not used as fuel during the electric motor drive mode in the electric vehicle, exhaust gas does not occur and noise is low.

Meanwhile, the electric vehicle is provided with a converter which converts high voltage generated by a high voltage battery into low voltage. The converter supplies electricity to electric components or charges a low voltage battery when the electric vehicle is driven by an electric motor. A DC-DC converter, which increases or drops voltage, is used as such a converter.

A control system of the converter for the electric vehicle may be associated with the danger that electric components of the electric vehicle can be damaged because of characteristics of the system treating high voltage.

If a wrong output of a PWM (pulse width modulation) signal is detected, the converter is determined to fail and an output of the PWM signal is stopped according to conventional arts. Herein, the wrong output of the PWM signal may occur due to a time delay of a circuit or failure of a CPU. If the PWM signal is not output, the converter is stopped and function of the electric vehicle is also stopped. If the function of the electric vehicle is stopped during driving, fuel consumption of the vehicle and driver's satisfaction may deteriorate.

In addition, failure control of the converter begins only after the PWM signal is output wrongly. Therefore, the electric components of the vehicle are stressed seriously by high voltage and high current generated due to the wrong output of the PWM signal from a point when the converter fails to a point when failure control of the converter is activated.

Therefore, a converter control with high reliability and quick protection function is necessary in order to prevent or minimize damage of the electric components of the vehicle when the converter fails or operates abnormally.

Meanwhile, a current sensor mounted at a high voltage terminal of the converter detects overcurrent due to wrong output of the PWM signal according to conventional arts for determining failure of the converter. If the current sensor detects the overcurrent, it is determined that the converter fails and output of the PWM signal is stopped.

The electric components can be badly damaged due to wrong output of the PWM signal if a current sensor operates sensitively, and output of the PWM signal can be stopped abnormally due to noise of the current sensor if the current sensor operates too sensitively according to conventional arts. To solve such problems, components responding to noise, high precision elements, and a test for obtaining threshold value of overcurrent are necessary. Therefore, research time may be very long and production cost may be high.

The above information disclosed in this Background section is only for enhancement of understanding of the background of the invention and therefore it may contain information that does not form the prior art that is already known in this country to a person of ordinary skill in the art.

SUMMARY OF THE INVENTION

The present invention has been made in an effort to provide a control method of a converter for an electric vehicle and a control system thereof having advantages of increasing reliability of failure determination and minimizing damage of electric components by quickly determining wrong output of a PWM signal and reducing a time interval between a point when the converter fails and a point when failure control of the converter is activated.

The present invention has been made in an effort to provide a control method of a converter for an electric vehicle and a control system thereof having further advantages of reducing research time and cost as a consequence that a current sensor is not used for determining failure of the converter and accordingly components responding to noise, high precision elements, and a test for obtaining a threshold value of overcurrent are not necessary.

A control method of a converter for an electric vehicle according to an exemplary embodiment of the present invention controls the converter of the electric vehicle where the converter is adapted to drop voltage, and a counting unit is adapted to count a signal generated by the converter.

In one or more embodiments, the control method includes inputting a signal generated by the converter to the counting unit during operation of the converter; counting the signal by the counting unit; determining whether a counting result of the counting unit corresponds to a predetermined interval; and deciding that the converter is out-of-order out-of-order in a case that the counting result does not correspond to the predetermined interval.

The signal generated by the converter may be a PWM signal.

The counting unit may stop an operation of the converter in a case that the converter is out-of-order.

The counting unit may report a failure signal of the converter to a CPU in a case that the converter is stopped.

It may be determined that the converter is not out-of-order and the counting unit is reset in a case that the counting result corresponds to the predetermined interval.

A control system of a converter for an electric vehicle according to another exemplary embodiment of the present invention controls the electric vehicle, where a converter converts voltage and a current sensor is mounted in a circuit of the converter.

In one or more embodiments, the control system includes a signal processing unit adapted to receive a signal from the current sensor; a CPU adapted to receive a signal from the signal processing unit; a PWM output buffer adapted to receive from the CPU and output a PWM signal; a counting unit adapted to extract the PWM signal between the CPU and the PWM output buffer and to determine a failure of the converter.

The converter may be a DC-DC converter that increases or drops voltage.

The converter may drop voltage generated by a high voltage battery and supplies the voltage to an electric load or charges a low voltage battery.

The current sensor may detect overcurrent.

The PWM output buffer may selectively output or not the PWM signal according to determination of the counting unit.

In one or more embodiments, the control system further includes an AND GATE adapted to generate an output value in a case that all the input terminals receive an input; and an OR GATE adapted to generate an output value in a case that at least one of the input terminals receive an input, wherein the counting unit receives the PWM signal of the CPU through the AND GATE and the OR GATE.

The counting unit may compare a time interval of the PWM signal output from the AND GATE and a time interval of the PWM signal output from the OR GATE with respective predetermined intervals.

In one or more embodiments, the control system further includes a clock generation unit adapted to always generate a clock signal during the electric vehicle drives, wherein the counting unit is adapted to count clock signals during the PWM signal output respectively from the AND GATE and the OR GATE and to calculate the time interval of the PWM signal output from the AND GATE and the time interval of the PWM signal output from the OR GATE.

The counting unit may determine that the converter does not fail and turns on the PWM output buffer in a case that the time interval of the PWM signal output from the AND GATE and the time interval of the PWM signal output from the OR GATE correspond to the respective predetermined intervals.

The counting unit determines that the converter fails and turns off the PWM output buffer in a case that the time interval of the PWM signal output from the AND GATE and the time interval of the PWM signal output from the OR GATE do not correspond to the respective predetermined intervals.

DESCRIPTION OF SYMBOLS

100: converter;
200: current sensor;
300: control system of a converter;
310: signal processing unit;
320: CPU;
330: PWM output buffer;
340: counting unit;
342: AND GATE;
344: OR GATE; and
350: clock generation unit.

DETAILED DESCRIPTION OF THE EMBODIMENTS

An exemplary embodiment of the present invention will hereinafter be described in detail with reference to the accompanying drawings.

It is understood that the term "vehicle" or "vehicular" or other similar term as used herein is inclusive of motor vehicles in general such as passenger automobiles including sports utility vehicles (SUV), buses, trucks, various commercial vehicles, watercraft including a variety of boats and ships, aircraft, and the like, and includes hybrid vehicles, electric vehicles, plug-in hybrid electric vehicles, hydrogen-powered vehicles and other alternative fuel vehicles (e.g. fuels derived from resources other than petroleum). As referred to herein, a hybrid vehicle is a vehicle that has two or more sources of power, for example both gasoline-powered and electric-powered vehicles.

An exemplary embodiment of the present invention provides a control method of a converter for an electric vehicle and a control system thereof that determines failure of the converter and occurrence of overcurrent independently.

Figure 1:
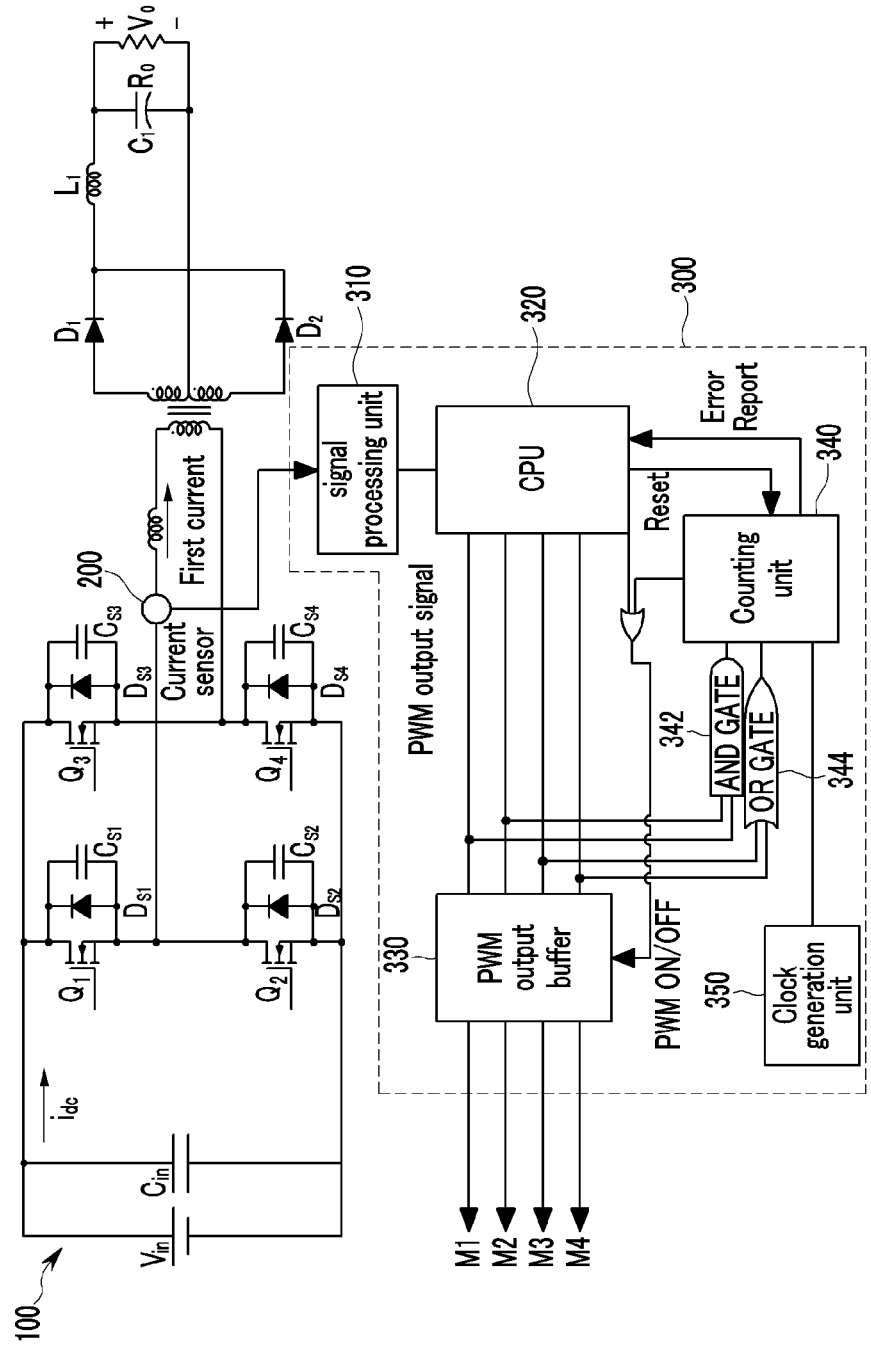
FIG. 1 is a circuit diagram of a control system of a converter for an electric vehicle according to an exemplary embodiment of the present invention.
Figure 2:
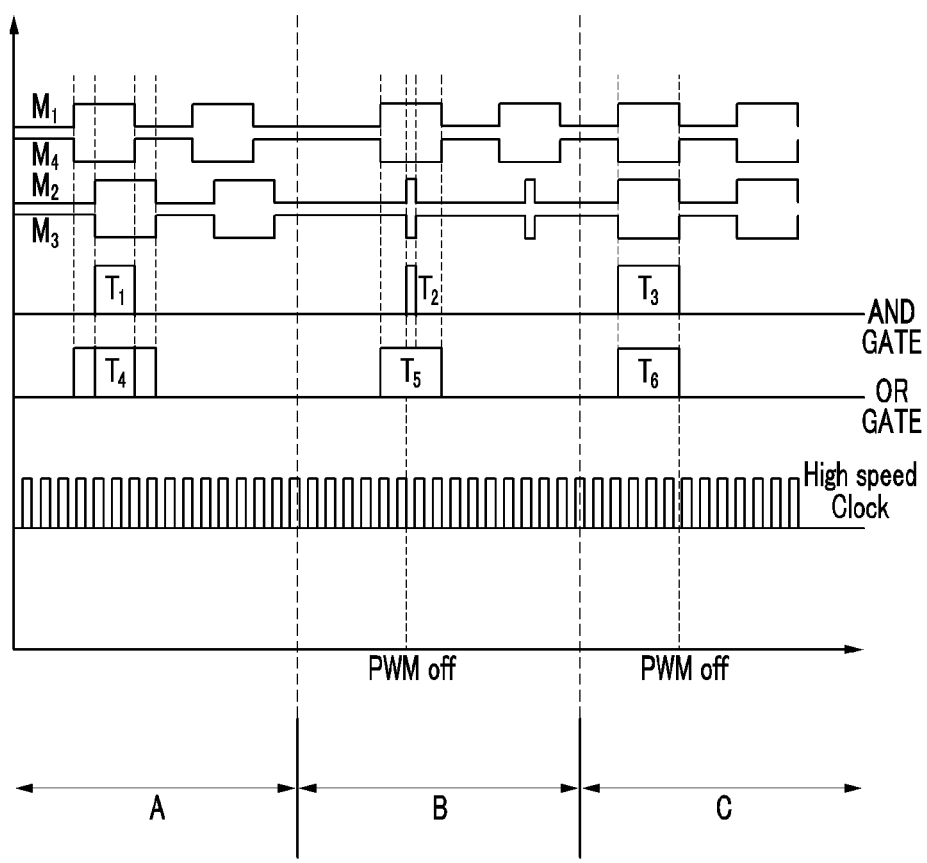
FIG. 2 is a graph for exemplifying a PWM signal and a clock signal applied to an exemplary embodiment of the present invention.
Figure 3:
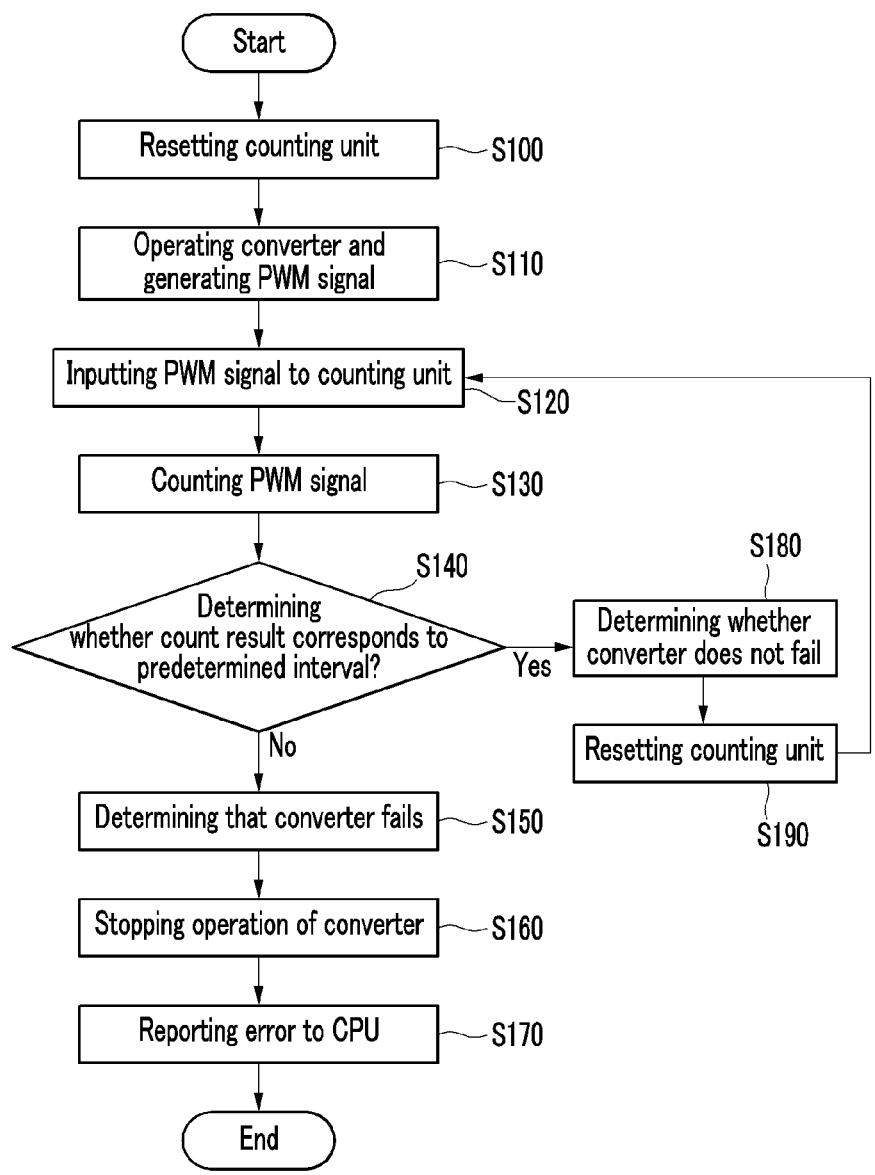
FIG. 3 is a flowchart of a control method of a converter for an electric vehicle according to an exemplary embodiment of the present invention.

Referring to FIGS. 1 to 3, a control method of a converter for an electric vehicle and a control system thereof according to an exemplary embodiment of the present invention will be described in detail.

FIG. 1 is a circuit diagram of a control system of a converter for an electric vehicle according to an exemplary embodiment of the present invention.

As shown in FIG. 1, a control system 300 of a converter for an electric vehicle according to an exemplary embodiment of the present invention controls the converter 100 converting voltage. A current sensor 200 is mounted at a circuit included in the converter 100. The control system 300 of a converter includes a signal processing unit 310, a CPU 320, a PWM output buffer 330, and a counting unit 340.

The converter 100 is mounted in the electric vehicle, and drops the voltage generated by a high voltage battery so as to supply electricity to an electric load or charges a low voltage battery. In one or more embodiments, the converter 100 is a DC-DC converter.

The current sensor 200 delivers a PWM signal generated by the converter 100 to a signal processing unit 310. In addition, the current sensor 200 detects overcurrent of the circuit and delivers it to the signal processing unit 310.

Delivering the PWM signal, the current sensor 200 only delivers the PWM signal generated by the converter 100 to the signal processing unit 310 but is not concerned in determination and control of the PWM signal in one or more embodiments. In addition, determination of the overcurrent is independently performed from delivery of the PWM signal by the current sensor 200.

The signal processing unit 310 delivers the PWM signal and an overcurrent occurrence signal received from the current sensor 200 to the CPU 320. In addition, the signal processing unit 310 receives signals from one or more sensors and reports operating condition of a device where each sensor is mounted to the CPU 320.

Delivering the PWM signal, the signal processing unit 310 only delivers the PWM signal received from the current sensor 200 to the CPU 320 but is not concerned in determination and control of the PWM signal in one or more embodiments In addition, delivery of the PWM signal is independently performed from reporting occurrence of the overcurrent by the signal processing unit 310.

The CPU 320 refers to a central processing unit which manages one or more control systems provided in the electric vehicle. Therefore, the CPU 320 receives one or more signals from the signal processing unit 310 and controls one or more devices. In addition, the CPU 320 receives the PWM signal from the signal processing unit 310, processes it into a PWM output signal, and then delivers the PWM output signal to the PWM output buffer 330.

The PWM output buffer 330 receives the PWM output signal from the CPU 320, processes it into a PWM signal, and then outputs the PWM signal. In addition, the PWM output buffer 330 does not output the PWM signal selectively according to a control signal received from the counting unit 340. Herein, the PWM signal and the PWM output signal may be the same or else may be different.

The counting unit 340 extracts the PWM signal between the CPU 320 and the PWM output buffer 330 and determines whether the converter 100 fails.

In further detail, the counting unit 340 counts the PWM signal and determines whether a counting result corresponds to a predetermined interval. If the counting result corresponds to the predetermined interval, the counting unit 340 determines that the converter 100 does not fail and turns on the PWM output buffer 330. If the counting result does not correspond to the predetermined interval, the counting unit 340 determines that the converter 100 fails and turns off the PWM output buffer 330. If the PWM output buffer 330 is turned off, the counting unit 340 reports failure of the converter 100 to the CPU 320.

When inputting the PWM signal to the counting unit 340, a part of the PWM signal extracted between the CPU 320 and the PWM output buffer 330 is input to the counting unit 340 through an AND GATE 342 and the other part thereof is input to the counting unit 340 through an OR GATE 344.

Herein, the AND GATE 342 generates output when all the input terminals of the circuit receive an input. In addition, the OR GATE 344 generates output when at least one of the input terminals receives an input.

The PWM signal passing through the AND GATE 342 and the PWM signal passing through the OR GATE 344 have respective predetermined intervals. In addition, the PWM signals of the AND GATE 342 and the OR GATE 344 may have the same or different predetermined intervals.

Time intervals of the PWM signals generated when the converter operates normally are set as the predetermined intervals. The time intervals of the PWM signals generated when the converter operates normally counting unit 340 are pre-stored. Therefore, a normal time interval of the PWM signal output from the AND GATE 342 and a normal time interval of the PWM signal output from the OR GATE 344 are pre-stored in the counting unit 340. The counting unit 340 is connected to a clock generation unit 350. The clock generation unit 350 generates a clock signal continuously on a constant short period. Therefore, the counting unit 340 counts the clock signal during the PWM signal is output from the AND GATE 342 and counts the clock signal during the PWM signal is output from the OR GATE 344. The time intervals of the PWM signals output from the AND GATE 342 and the OR GATE 344 are calculated by multiplying the number of the clock signals that is counted and the period. It is determined whether the converter 100 operates normally or not by comparing the time intervals of the PWM signals output from the AND GATE 342 and OR GATE 344 with the normal time intervals of the PWM signals.

FIG. 2 is a graph for exemplifying a PWM signal and a clock signal applied to an exemplary embodiment of the present invention.

As shown in FIG. 2, a phase-shift control method is applied to a control method of a converter for an electric vehicle and a control system thereof according to exemplary embodiments of the present invention.

The phase-shift control method is a method where after M1 and M4 are synchronized and M2 and M3 are synchronized as shown in FIG. 2, the PWM signal is controlled by changing phases of M2 and M3. The phase-shift control method is well known to a person of an ordinary skill in the art, and detailed description thereof will be omitted.

A region is a region where the PWM signal according to the phase-shift control method is output normally.

T1 is a time when the PWM signal is normally output from the AND GATE 342 during one period. In addition, T4 is a time when the PWM signal is normally output from the OR GATE 344 during one period.

That is, T1 and T4 are outputs of the PWM signals when the converter 100 operates normally, and are used respectively as the predetermined intervals of the AND GATE 342 and the OR GATE 344.

The counting unit 340 calculates the time intervals of the PWM signals by counting the clock signals during the PWM signal is output, and determines whether the converter 100 operates normally or not by comparing the time intervals of the PWM signals with T1 and T4.

The B region is a hard switching region due to wrong output of the PWM signals. In addition, the C region is a phase-to-phase short circuit due to wrong output of the PWM signals.

Generally, the phase-to-phase short circuit is a short circuit of two phases in three-phase circuit. Herein, the phase-to-phase short circuit means a phase-to-phase short circuit of a field effect transistor (FET).

The time intervals of the PWM signals output from the AND GATE and the OR GATE does not correspond respectively to T1 and T4 at B region and C region. That is, the time intervals of the PWM signals output from the AND GATE and the OR GATE are shorter than the T1 and T4 at B region. The time interval of the PWM signal output from the AND GATE is longer than T1 and the time interval of the PWM signal output from the OR GATE is shorter than T4 at C region. In this case, the counting unit 340 determines that the converter 100 fails.

Since the outputs of the PWM signals are directly checked, the wrong output of the PWM signals can be quickly detected according to an exemplary embodiment of the present invention. Therefore, reliability of the failure determination of the converter 100 is increased.

Referring to FIG. 3, a control method of a converter for an electric vehicle according to an exemplary embodiment of the present invention will be described in detail.

FIG. 3 is a flowchart of a control method of a converter for an electric vehicle according to an exemplary embodiment of the present invention.

As shown in FIG. 3, after the counting unit 340 is reset at a step S100, the converter 100 operates and generates the PWM signal at a step S110. In addition, the beginning of generation of the PWM signal by the converter 100 also means beginning of failure determination of the converter 100.

In a case that the converter 100 operates, the PWM signal generated by the converter is input to the counting unit 340 at a step S120.

At the step S120, the PWM signal generated by the converter 100 may be input to the counting unit 340 after passing sequentially through the current sensor 200 mounted at the circuit of the converter 100, the signal processing unit 310 disposed at the exterior of the converter 100, and the CPU 320 managing one or more control systems of the electric vehicle.

The CPU 320 delivers the PWM output signal to the PWM output buffer 330. In addition, the counting unit 340 extracts the PWM output signal between the CPU 320 and the PWM output buffer 330.

If the PWM signal extracted between the CPU 320 and the PWM output buffer 330 is input to the counting unit 340, the counting unit 340 counts the PWM signal at a step S130.

As shown in FIG. 1 and FIG. 2, the clock signals generated by the clock generation unit 350 can be used at the step S130.

If the PWM signal is counted at the step S130, the counting unit 340 determines whether the counting result corresponds to the predetermined interval at a step S140.

As shown in FIG. 2, the normal time interval of the PWM signal output from the AND GATE 342 and the normal time interval of the PWM signal output from the OR GATE 344 are pre-stored in the counting unit 340. In addition, the predetermined interval can be set considering of a permissible error. That is, a value calculated by adding the permissible error to the normal time interval of the PWM signal or subtracting the permissible error from the normal time interval of the PWM signal can be set as the predetermined interval.

If the counting result does not correspond to the predetermined interval at the step S140, the counting unit 340 determines that the converter 100 fails at a step S150.

If it is determined that the converter 100 fails, the counting unit 340 stops operation of the converter 100 in order not to input the PWM signal to the converter 100 at a step S160.

If the converter 100 is stopped, the counting unit 340 reports a failure signal of the converter to the CPU at a step S170. In addition, if error report is completed, an exemplary embodiment of the present invention is finished.

If the counting result corresponds to the predetermined interval at the step S140, the counting unit 340 determines that the converter 100 does not fail at a step S180.

If it is determined that the converter 100 does not fail, the CPU 320 resets the counting unit 340 at a step S190 and returns to the step S120.

As shown in FIG. 1, the CPU 320 can reset the counting unit at the step S100 or the step S190.

Meanwhile, it is to be understood that the electric vehicle includes all the vehicles driven by electricity in this specification.

As described above, since an output of a PWM signal is checked in real time and wrong output of the PWM signal is quickly detected, damage of electric components in a vehicle due to the wrong output of the PWM signal may be minimized according to an exemplary embodiment of the present invention. In addition, since normal operating range of the PWM signal is set, functions of the electric vehicle may not be stopped unnecessarily. Therefore, reliability of the converter may be increased and damage of the electric components may be minimized.

Since a current sensor is not used for determining whether the converter fails, components responding to noise, high precision elements, and a test for obtaining threshold value of overcurrent are not necessary. Therefore, research time and cost may be reduced.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A method for control of an electric vehicle converter, wherein the converter is adapted to drop voltage, the method comprising:
    inputting a signal generated by the converter to a counting unit of the electric vehicle during operation of the converter;
    counting the signal by the counting unit;
    determining whether a counting result of the counting unit corresponds to a predetermined interval; and
    deciding that the converter is out-of-order in a case that the counting result does not correspond to the predetermined interval;
    generating at an AND GATE an output value in a case that all the input terminals receive an input; and
    generating at an OR GATE an output value in a case that at least one of the input terminals receive an input,
    wherein the counting unit receives the signal through the AND GATE and the OR GATE.

2. The method of claim 1, wherein the signal generated by the converter is a pulse width modulation (PWM) signal.

3. The method of claim 1, wherein the counting unit stops an operation of the converter in a case that the converter is out-of-order.

4. The method of claim 3, wherein the counting unit reports a failure signal of the converter to a CPU in a case that the converter is stopped.

5. The method of claim 1, wherein it is determined that the converter is not out-of-order and the counting unit is reset in a case that the counting result corresponds to the predetermined interval.

6. A system to control a converter for an electric vehicle, wherein the converter is adapted to convert voltage, and wherein a current sensor is mounted in a circuit of the converter, the system comprising:
    a signal processing unit configured to receive a signal from the current sensor;
    a CPU configured to receive a signal from the signal processing unit;
    a pulse width modulation (PWM) output buffer configured to receive from the CPU and output a PWM signal;
    a counting unit configured to extract the PWM signal between the CPU and the PWM output buffer and to determine a failure of the converter;
    an AND GATE configured to generate an output value in a case that all the input terminals receive an input; and
    an OR GATE configured to generate an output value in a case that at least one of the input terminals receive an input,
    wherein the counting unit receives the PWM signal of the CPU through the AND GATE and the OR GATE.

7. The control system of claim 6, wherein the converter is a DC-DC converter configured to increase or drop voltage.

8. The control system of claim 7, wherein the converter is configured to drop voltage generated by a high voltage battery and to supply the voltage to an electric load or charge a low voltage battery.

9. The control system of claim 6, wherein the current sensor is configured to detect overcurrent.

10. The control system of claim 6, wherein the PWM output buffer is configured to selectively output or not the PWM signal according to determination of the counting unit.

11. The control system of claim wherein the counting unit is configured to compare a time interval of the PWM signal output from the AND GATE and a time interval of the PWM signal output from the OR GATE with respective predetermined intervals.

12. The control system of claim 11, further comprising a clock generation unit configured to generate clock signal while the electric vehicle drives,
wherein the counting unit is configured to count clock signals during the PWM signal is output respectively from the AND GATE and the OR GATE and to calculate the time interval of the PWM signal output from the AND GATE and the time interval of the PWM signal output from the OR GATE.

13. The control system of claim wherein 11, the counting unit is configured to determine that the converter does not fail and to turn on the PWM output buffer in a case that the time interval of the PWM signal output from the AND GATE and the time interval of the PWM signal output from the OR GATE correspond to the respective predetermined intervals.

14. The control system of claim 11, wherein the counting unit is configured to determine that the converter fails and to turn off the PWM output buffer in a case that the time interval of the PWM signal output from the AND GATE and the time interval of the PWM signal output from the OR GATE do not correspond to the respective predetermined intervals.

* * * * *